(12) United States Patent
Hendrix et al.

(10) Patent No.: US 6,204,158 B1
(45) Date of Patent: Mar. 20, 2001

(54) REDUCED DIFFUSION OF A MOBILE SPECIE FROM A METAL OXIDE CERAMIC INTO THE SUBSTRATE

(75) Inventors: Bryan C. Hendrix, Danbury, CT (US); Frank S. Hintermaier, Munich (DE); Jeffrey F. Roeder, Brookfield, CT (US); Thomas H. Baum, New Fairfield, CT (US); Debra A. Desrochers, Brookfield, CT (US)

(73) Assignees: Advanced Technology Materials, Inc., Danbury, CT (US); Infineon Technologies North America Corp., Cupertino, CA (US)

( * ) Notice: Subject to any disclaimer, the term of this patent is extended or adjusted under 35 U.S.C. 154(b) by 0 days.

(21) Appl. No.: 09/216,371

(22) Filed: Dec. 18, 1998

(51) Int. Cl.$^7$ .................................................. H01L 21/38
(52) U.S. Cl. .............................. 438/563; 438/3; 438/240
(58) Field of Search ................................... 438/240, 241, 438/5, 3, 596, 563, 396

(56) References Cited

U.S. PATENT DOCUMENTS

| 5,859,274 | | 1/1999 | Baum et al. |
| 5,923,970 | * | 7/1999 | Kirlin ....................................... 438/240 |
| 5,943,568 | * | 8/1999 | Fujii et al. ............................... 438/240 |
| 6,020,233 | * | 2/2000 | Kim ......................................... 438/240 |
| 6,025,205 | * | 2/2000 | Park et al. ................................. 438/3 |

OTHER PUBLICATIONS

U.S. application No. 08/975,087, Hintermaier et al., filed Nov. 20, 1997.
U.S. application No. 09/107,861, Hintermaier et al., filed Jun. 30, 1998.
Budd et al., "Sol–gel processing of lead titanate (PbTiO$_3$), lead zirconate (PbZrO$_3$), PZT and PLZT thin films" Brit. Ceram. Soc., Proc., vol. 36, p. 107, 1985.

Brierley et al., "The growth of ferroelectric oxides by MOCVD" Ferroelectrics, vol. 91, p. 181, 1989.

Takayama et al., "Preparation of epitaxial Pb(Zr$_x$Ti$_{1-x}$)O$_3$ thin films and their crystallographic, pyroelectric, and ferroelectric properties" J. Appl. Phys., vol. 65, 1989, p. 1666.

Hideo Kidoh et al., "Preparation of Pb(Zr, Ti)O3 Films on Si Substrate by Laser Ablation" Jpn. J. Appl. Phys., vol. 31, 1992, pp. 2965–2967.

Masuda et al, "Mechanism of Stoichiometric Deposition of Volatile Elements in Multimetal–Oxide Films Prepared by Pulsed Laser Ablation" Jpn. J. Appl. Phys. vol. 35, 1996, pp. 237–240.

William S. Rees, Jr.,Editor, Rees, "CVD of nonmetals" (1996) ISBN 3–527–29295–0.

\* cited by examiner

*Primary Examiner*—David Nelms
*Assistant Examiner*—Dung A Le
(74) *Attorney, Agent, or Firm*—Oliver A. M. Zitzmann; Robert A. Whitman

(57) ABSTRACT

A scavenger layer is provided to prevent the diffusion of an excess mobile specie from a metal oxide ceramic into unwanted parts of a device. The scavenger layer is provided above the metal oxide ceramic. As the excess mobile specie diffuses out of the metal oxide ceramic, it migrates toward the scavenger layer and reacts with it. The reaction consumes the excess mobile specie.

14 Claims, 7 Drawing Sheets

REDUCED DIFFUSION OF A MOBILE SPECIE FROM A METAL OXIDE CERAMIC INTO THE SUBSTRATE

FIELD OF THE INVENTION

The invention relates generally to metal oxide ceramic films used in integrated circuits (ICs). More particularly, the invention relates to preventing a mobile specie in a metal oxide ceramic film from adversely impacting a semiconductor device incorporating the metal oxide ceramic film.

BACKGROUND OF THE INVENTION

Metal oxide ceramic materials have been investigated for their use in ICs. For example, metal oxide ceramics that are ferroelectrics or are capable of being transformed into ferroelectrics are useful due to their high remanent polarization (2Pr) and reliable long-term storage characteristics. Non-ferroelectric metal oxide ceramics, such as superconductors, have also been investigated.

Various techniques, such as sol-gel, chemical vapor deposition (CVD), sputtering, or pulsed laser deposition (PLD), have been developed for depositing ferroelectric films on a substrate. Such techniques, for example, are described, for example, Budd et al., Brit. Ceram. Soc. Proc., 36, p107 (1985); Brierley et al., Ferroelectrics, 91, p181 (1989); Takayama et al., J. Appl. Phys., 65, p1666 (1989); Morimoto et al., J. Jap. Appl. Phys. 318, 9296 (1992); and co-pending U.S. patent applications Ser. No. 08/975,087, titled "Low Temperature CVD Process using B-Diketonate Bismuth Precursor for the Preparation of Bismuth Ceramic Thin Films for Integration into Ferroelectric Memory Devices," U.S. Ser. No. 09/107,861, titled "Amorphously Deposited Metal Oxide Ceramic Films," all of which are herein incorporated by reference for all purposes.

Metal oxide ceramics are often treated with a post-deposition thermal process at a relatively high temperature in order to produce resulting materials with the desired electrical characteristics. For example, some Bi-based oxide ceramics such as strontium bismuth tantalate (SBT) are thermally treated by a "ferroanneal." The ferroanneal converts the as-deposited films into the ferroelectric phase. After the as-deposited films are converted into the ferroelectric phase, the ferroanneal continues, growing the grain size (e.g., greater than about 180 nm) of the films in order to achieve a good remanent polarization. Other types of metal oxide ceramics can be deposited as ferroelectrics. For example, lead zirconium titanate (PZT) is often deposited at relatively higher temperatures, such as greater than 500° C., to form an as-deposited film with a ferroelectric perovskite phase. Although the PZT is generally deposited as a ferroelectric, a post-deposition thermal process is often still needed to improve its electrical characteristics.

Typically, the metal oxide ceramic materials contain a mobile specie which easily diffuses into other regions of the IC. Diffusion of the mobile specie into other regions can have a detrimental effect on the performance and functionality of the IC. For example, in the case of Bi-based oxide ceramics, the diffusion of Bi into other regions of the IC can alter stress, cause shorts and/or alter the electrical properties of the diffusion regions of devices, thus adversely impacting functionality of the IC.

In view of the foregoing discussion, it is desirable to prevent unwanted diffusion of a mobile specie from a metal oxide ceramic material.

SUMMARY OF THE INVENTION

The invention relates to reducing or minimizing diffusion of an excess mobile specie from a metal oxide ceramic into unwanted regions of a device. In accordance with the invention, a scavenger layer is provided above the metal oxide ceramic layer. The scavenger layer reacts with the excess mobile specie, preventing it from diffusing into, for example, the substrate, In one embodiment, a substrate is provided. The substrate is prepared to include, for example, a partially formed semiconductor device. A metal oxide ceramic is deposited on the prepared substrate. The metal oxide comprises, in one embodiment, a Bi-based metal oxide that can be transformed into a ferroelectric.

A pre-anneal is performed to form nuclei of the ferroelectric phase in the metal oxide layer without causing substantial diffusion of the excess mobile specie. The pre-anneal is performed at about 650–700° C. for about 10–30 minutes.

In one embodiment, a scavenger layer is formed over the metal oxide ceramic layer. The scavenger layer comprises a material which reacts with the excess mobile specie. In one embodiment, the scavenger layer comprises Ti or $TiO_2$. After the scavenger layer is formed, an anneal is performed to grow the grains of the metal oxide ceramic in order to achieve the desired electrical characteristics. The substrate is annealed at, for example, 700–800° C. for about 5–30 minutes.

The anneal also cause the excess mobile specie to diffuse out of the metal oxide ceramic and react with the scavenger layer. The reaction consumes the excess mobile specie, preventing it from diffusing into other regions of the device.

A conductive layer is formed over the scavenger layer. The conductive layer serves as an electrode from which an electric field is applied to the metal oxide ceramic.

In another embodiment, the scavenger layer is removed by etching or chemical mechanical polishing (CMP) prior to forming the top electrode. Alternatively, the scavenger layer could be formed over the top electrode. The scavenger layer can be removed or left on as part of the device, depending on the nature of the scavenger layer subsequent electrical properties and their affect on device performance.

DETAILED DESCRIPTION OF THE INVENTION

Figure 1:
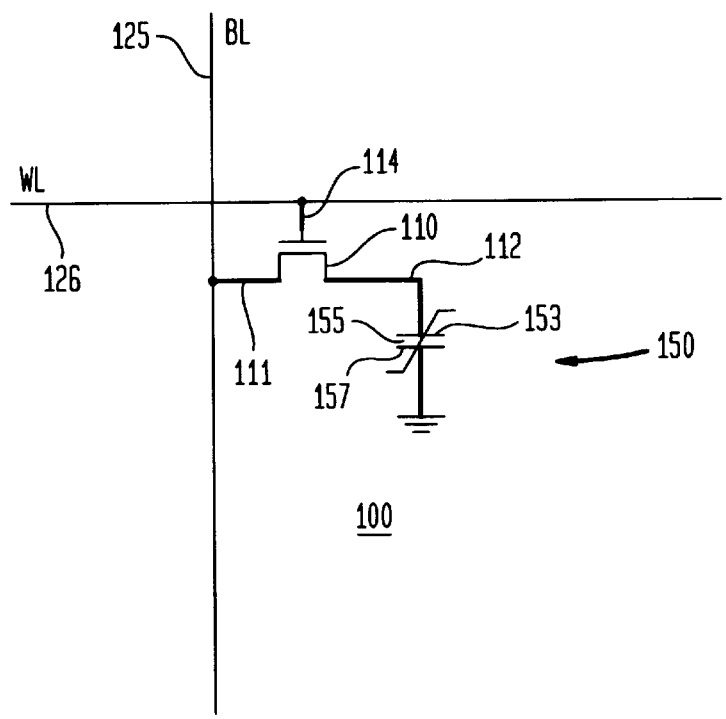
FIG. 1 shows a schematic diagram of an illustrative embodiment of the invention.

The invention relates to metal oxide ceramic films and their applications in ICs. More particularly, the invention relates to reducing the diffusion of a mobile specie from a metal oxide ceramic into unwanted areas of a device incorporating the metal oxide ceramic.

A substrate is provided on which the metal oxide ceramic is formed. The substrate can be prepared to include a partially formed semiconductor device used in, for example, an IC. The term "substrate" can be used to refer to the substrate or the substrate including the partially formed device. A conductor is provided from which a field is applied to the metal oxide ceramic film. Devices incorporating the metal oxide ceramic film include, for example, capacitors or transistors. Metal oxide ceramics are also used in, for example, filters, high epsilon ceramics, microwave antennas, and macro actuators.

The metal oxide ceramic comprises, for example, a material that is a ferroelectric or is capable of being transformed into a ferroelectric. The ferroelectric metal oxide ceramic is incorporated in a semiconductor device such as a ferroelectric capacitor of a non-volatile ferroelectric memory cell. The ferroelectric memory cells are used to form ICs including non-volatile memories and embedded ferroelectric memories. Other semiconductor devices that incorporate the ferroelectric metal oxide are also useful. include, for example, a ferroelectric transistor.

In accordance with the invention, a sink which prevents a mobile specie of the metal oxide ceramic from diffusing into unwanted regions of the IC such as the plug and/or substrate is provided. The mobile specie that diffuses out of the metal oxide ceramic layer is referred to as an "excess mobile specie." The mobile specie can be in the form of atoms, molecules, or compounds.

In one embodiment of the invention, the sink comprises a scavenger layer which reacts with the excess mobile specie diffusing out of the metal oxide ceramic, consuming the excess mobile specie. The scavenger layer is provided above the metal oxide ceramic layer. The scavenger layer can be in direct contact with an upper surface of the metal oxide ceramic layer or above a conductive layer which applies a field to the metal oxide ceramic layer, such as the gate electrode of a transistor or an upper electrode of a capacitor.

The scavenger layer comprises a material that reacts with the excess mobile specie from the metal oxide ceramic material. In one embodiment, the scavenger layer comprises a metal or metal oxide that reacts with the excess mobile specie that diffuses out of the metal oxide ceramic layer during the post-deposition thermal process. The reaction consumes the excess mobile specie, thereby preventing it from diffusing into other regions of the IC.

The resulting scavenger layer after the reaction, in some cases, is a relatively inactive layer. This relatively inactive layer can either be incorporated as part of an IC structure without effectively affecting the functionality of the IC or it can be removed if desired. In the case where the reaction produces a resulting scavenger layer that affects the functionality of the IC undesirably, it is removed.

Referring to FIG. 1, a schematic diagram of a ferroelectric memory cell 100 in accordance with one embodiment of the invention is shown. As shown, the memory cell comprises a transistor 110 and a ferroelectric capacitor 150. A first electrode 111 of the transistor is coupled to the bitline 125 and a second electrode 112 is coupled to the capacitor. A gate electrode of the transistor is coupled to the wordline 126.

The ferroelectric capacitor comprises first and second plates 153 and 157 separated by a ferroelectric layer. The first plate 153 is coupled to the second electrode of the transistor. The second plate typically serves as a common plate in the memory array.

The ferroelectric layer comprises a metal oxide ceramic. In one embodiment, the ferroelectric layer comprises a Bi-based metal oxide. The Bi-based metal oxide is transformed into a film with the desired electrical properties, such as high 2Pr, by post-deposition heat treatment. The Bi-based metal oxide ceramic includes, for example, strontium bismuth tantalum (SBT) or derivatives of SBT. Other metal oxide ceramics such as PZT or PZT derivatives are also useful. The metal oxide ceramic can be formed with a composition tailored to reduce diffusion of the excess mobile specie therefrom, as described in concurrently filed U.S. patent application Ser. No. 09/216,370 titled "Reduced Degradation of Metal Oxide Ceramic Due to Diffusion of a Mobile Specie Therefrom" (Attorney Docket Number 97P7947US01), which is herein incorporated by reference for all purposes.

In accordance with the invention, diffusion of an excess mobile specie from the ferroelectric metal oxide ceramic is reduced or minimized by the use of a scavenger layer. The scavenger layer reacts with the mobile specie to reduce or minimize the diffusion of a mobile specie into unwanted parts of the device, such as the plug and/or the substrate.

Typically a plurality of memory cells is interconnected with wordlines and bitlines to form an array in a memory IC. Access to the memory cell is achieved by providing the appropriate voltages to the wordline and bitline, enabling data to be written or read from the capacitor.

Figure 2A:
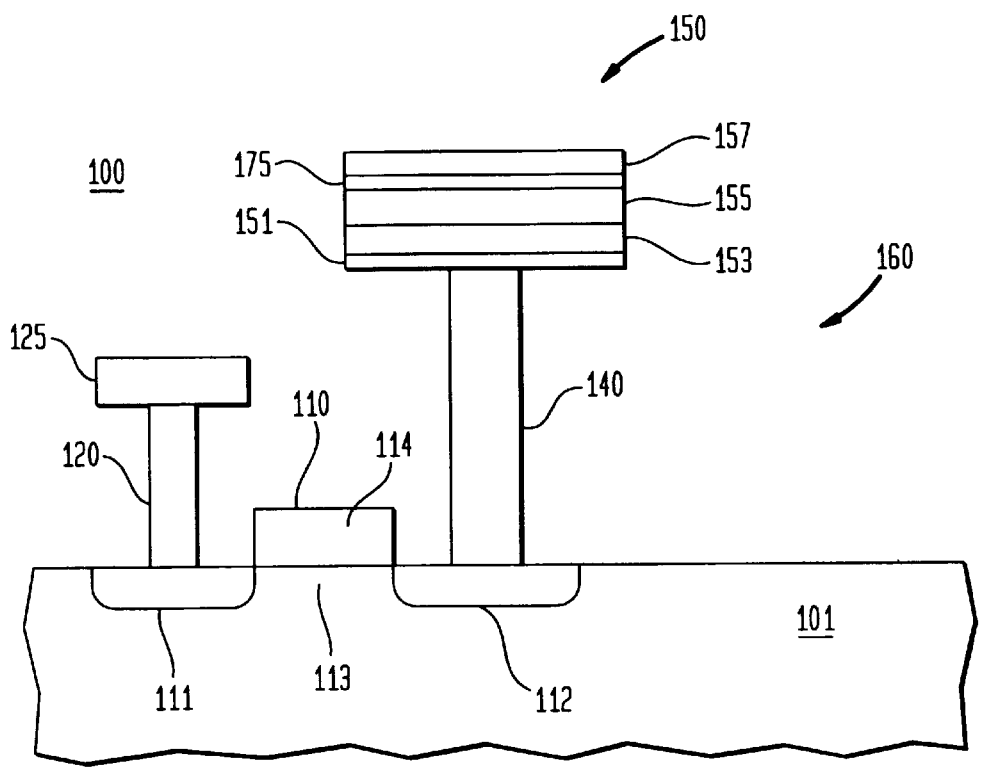
FIGS. 2a–c show cross-sectional views of embodiments of the invention.

Referring to FIG. 2a, a cross-section of an illustrative ferroelectric memory cell 100 in accordance with one embodiment of the invention is shown. The memory cell comprises a transistor 110 on a substrate 101 such as a semiconductor wafer. The transistor includes diffusion regions 111 and 112 separated by a channel 113, above which is located a gate 114. A gate oxide (not shown) separates the gate from the channel. The diffusion regions comprise dopants which are p-type or n-type. The type of dopants chosen is dependent upon the type of transistor desired. For example, n-type dopants such as arsenic (As) or phosphorus (P) are used for n-channel devices, and p-type dopants such as boron (B) are used for p-channel devices. Depending on the direction of current flow between the diffusion regions, one is referred to as the "drain" and the other the "source." The terms "drain" and "source" are herein used interchangeably to refer to the diffusion regions. Typically, the current flows from the source to drain. The gate represents a wordline, and one of the diffusion regions 111 is coupled to a bitline by a contact plug 120.

A capacitor 150 is coupled to diffusion region 112 via a contact plug 140. The capacitor comprises bottom and top electrodes 153 and 157 separated by a ferroelectric layer 155. The electrodes are typically formed from noble metal such as, for example, Pt.

A barrier layer 151 is typically provided between the bottom electrode and contact plug. The barrier layer inhibits the diffusion of oxygen into the contact plug 140. Additionally, the barrier layer may serve to restrict the diffusion of atoms from the plug into the ferroelectric layer and the migration of atoms from the bottom electrode or ferroelectric layer into the plug.

Figure 2B:
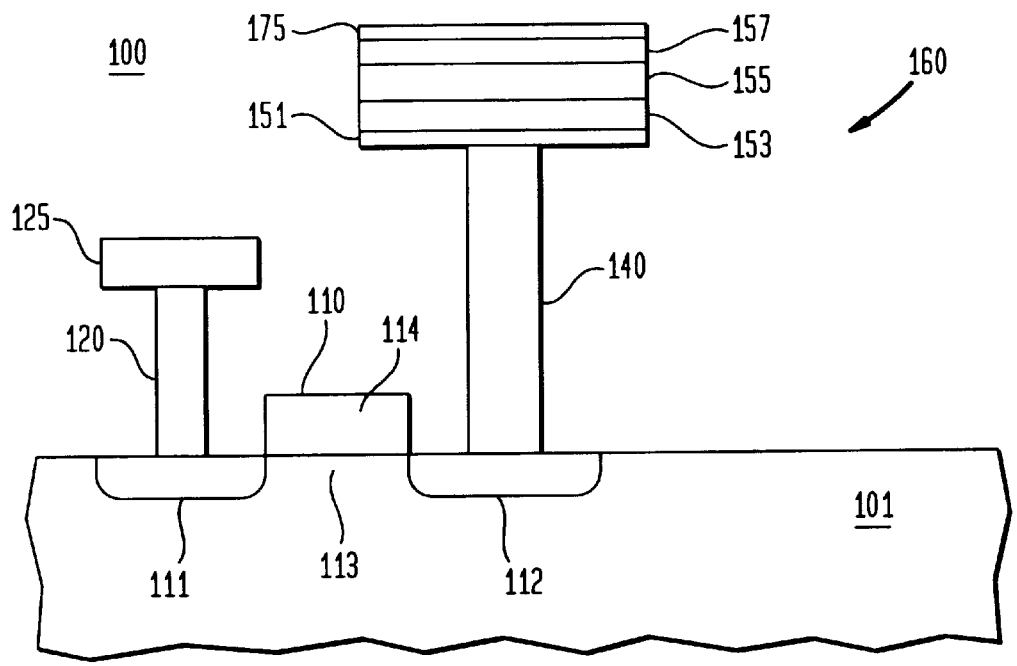
Figure 2C:
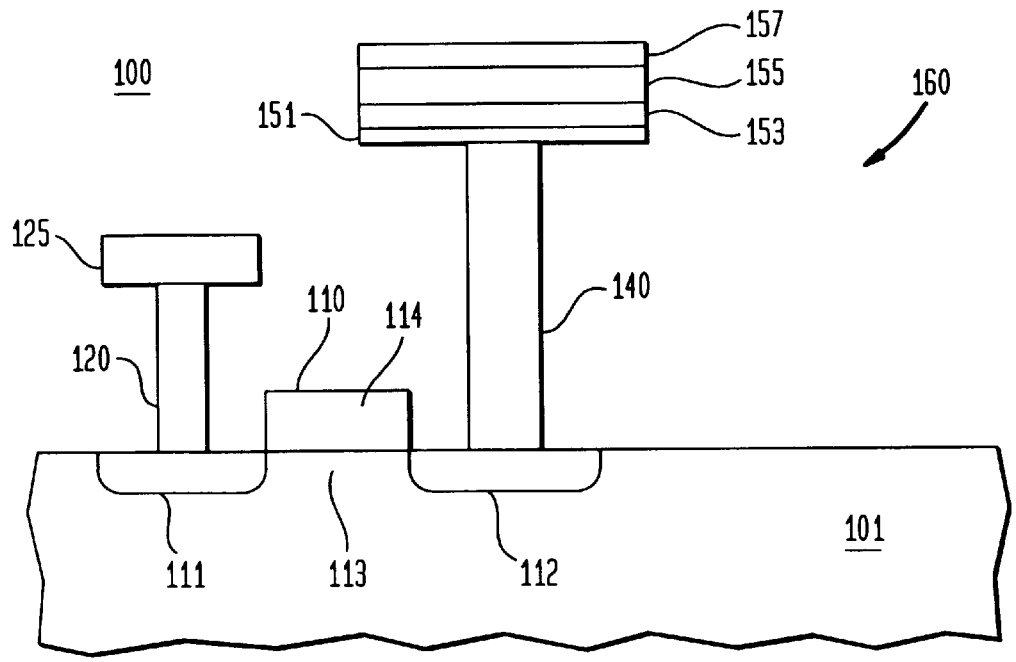

In accordance with one aspect of the invention, a scavenger layer 175 is provided above the ferroelectric layer 155. The scavenger layer comprises a metal or metal oxide that reacts with the excess mobile specie from the metal oxide ceramic layer. In one embodiment, the scavenger layer 175 is provided directly above the ferroelectric layer 155. Removing the scavenger layer after reacting with the mobile specie can also be useful if it undesirably affects the operation of the device. Providing the scavenger layer above the upper electrode 157, as shown in FIG. 2b, is also useful. The scavenger layer causes the excess mobile specie to react with it by diffusing up through the upper electrode. The scavenger layer can be removed as shown in FIG. 2c or left as part of the device.

An interlevel dielectric (ILD) layer 160 is provided to isolate the different components of the memory cell. The ILD layer comprises, for example, silicate glass such as silicon dioxide ($SiO_2$) or silicon nitride ($Si_3N_4$). Doped silicate glass such as borophosphosilicate glass (BPSG), borosilicate glass (BSG), or phosphosilicate glass (PSG) are also useful. Other types of dielectric materials can also be used.

Figure 3A:
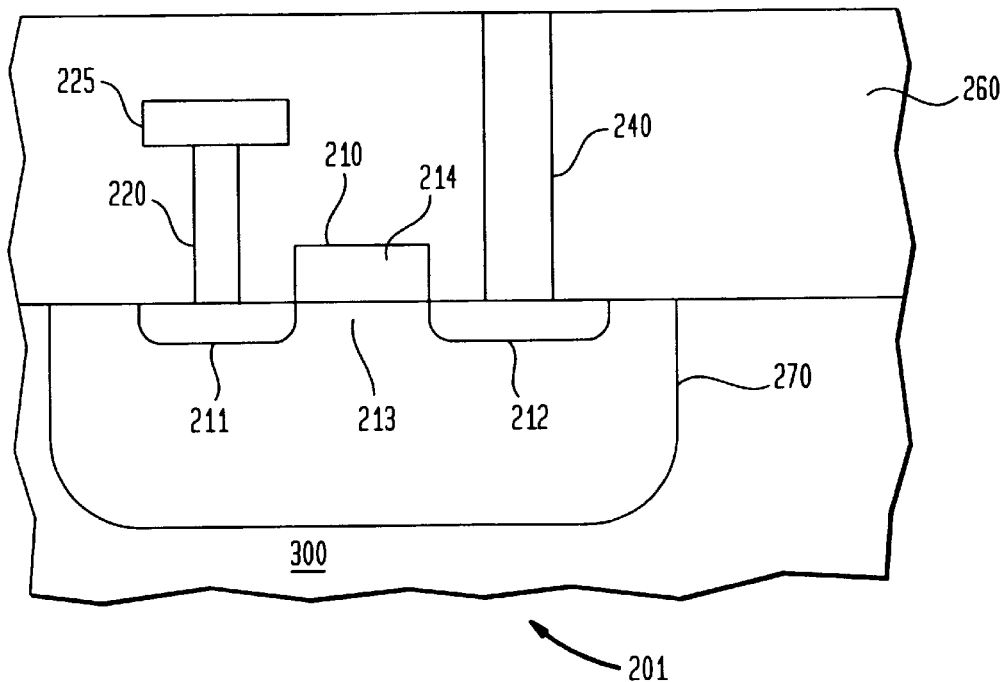
FIGS. 3a–c show a process for forming a device in accordance with one embodiment of the invention.
Figure 3B:
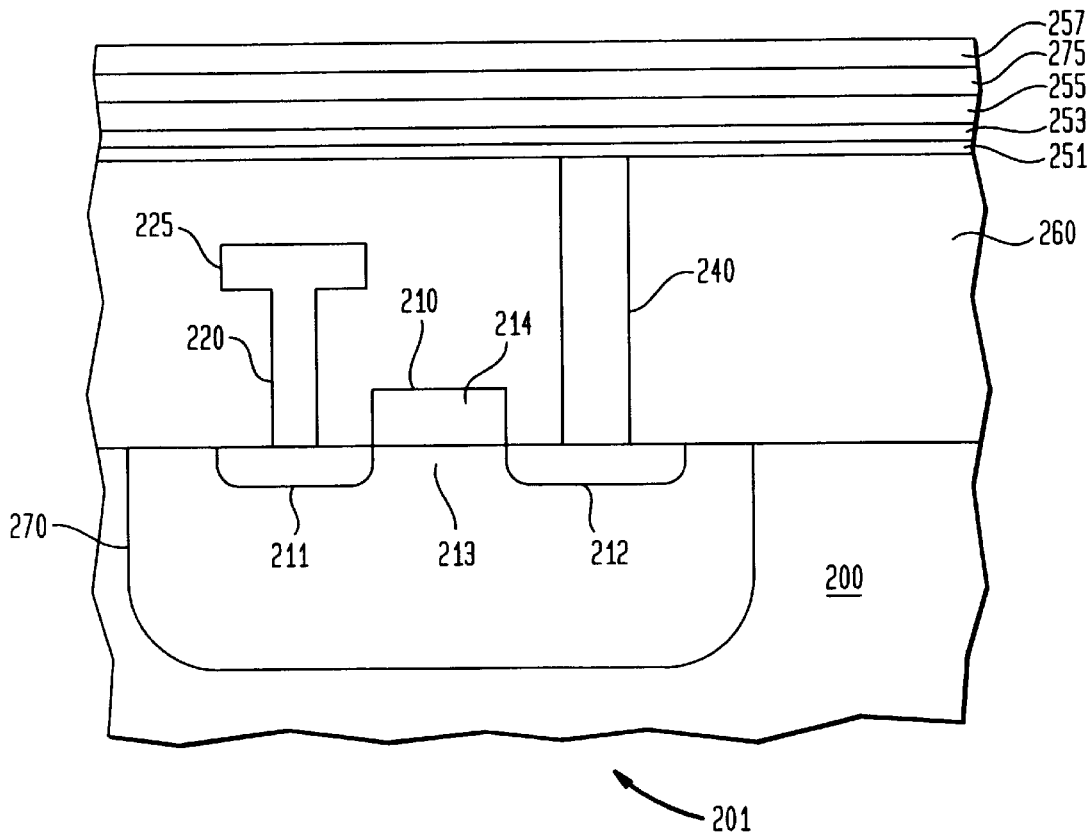
Figure 3C:
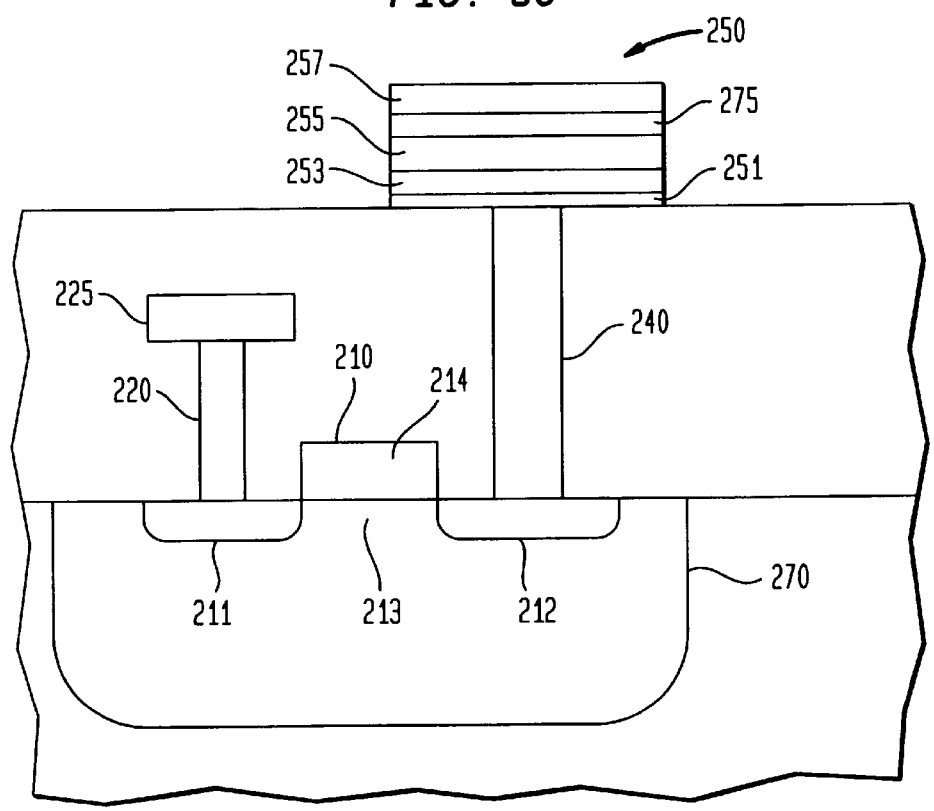

The memory cell 100 is formed by a process sequence described in FIGS. 3a–b. Referring to FIG. 3a, a substrate 201 comprising a partially formed device is shown. As shown, the substrate 201 includes a transistor 210. The substrate, for example, is a semiconductor wafer comprising silicon. Other types of substrates such as germanium (Ge), gallium arsenide (GaAs), or other semiconductor compounds can also be used. Typically, the substrate is lightly doped with p-type dopants such as B. More heavily doped substrates are also useful. A heavily doped substrate with a lightly doped epitaxial (epi) layer such as a p-/p+ substrate can also be used. N-type doped substrates, including lightly doped, heavily doped, or heavily doped substrates with a lightly doped epi layer, are also useful.

A doped well 270 comprising dopants, if necessary, is provided to prevent punchthrough. The doped well is formed by selectively implanting dopants into the substrate in the region where the transistor is formed. In one embodiment, the doped well is formed by implanting p-type dopants such as B into the substrate. The p-type doped well (p-well) serves as a doped well for n-channel devices. The use of an n-type doped well (n-well) comprising, for example, As or P dopants is also useful for p-channel devices.

Diffusion regions 211 and 212 are formed by selectively implanting dopants having a second electrical type into the desired portions of the substrate. In one embodiment, n-type dopants are implanted into the p-type well used for n-channel devices and p-type dopants are used for p-channel devices. An implant may also be performed to implant dopants into the channel region 213 between the diffusion regions to adjust the gate threshold voltage ($V_T$) of the transistor. Forming the diffusion regions after gate formation is also useful.

Various layers are deposited on the substrate and patterned to form a gate 214. The gate, for example, include gate oxide and polycrystalline silicon (poly) layers. The poly is, for example, doped. In some cases, a metal silicide layer is formed over the doped poly, producing a polysilicon-silicide (polycide) layer to reduce sheet resistance. Various metal silicides, including molybdenum ($MoSi_x$), tantalum ($TaSi_x$), tungsten ($WSi_x$), titanium silicide ($TiSi_x$) or cobalt silicide ($CoSi_x$), are useful. Aluminum or refractory metals, such as tungsten and molybdenum, can be used alone or in combination with silicides or poly.

Contact plug 220 coupling diffusion region 211 to a bitline 225 and contact plug 240 coupled to diffusion region 212 can be formed after completion of the transistor using various known techniques such as, for example single or dual damascene techniques. Reactive ion etch (RIE) techniques are also useful. A combination of damascene and etch techniques can also be used. The contact plugs comprise a conductive material such as doped poly or tungsten (W). Other conductive materials are also useful. The bitline, for example, comprises aluminum (Al) or other types of conductive materials. An ILD layer 260 isolates the different components of the memory cell.

Referring to FIG. 3b, the process continues to form the ferroelectric capacitor. To prevent or reduce migration of atoms between the contact plug 240 and the subsequently formed ferroelectric layer, a conductive electrode barrier layer 251 is formed over the ILD layer. The electrode barrier layer comprises, for example, titanium nitride (TiN). Other materials such as $IrSi_xO_y$, $CeO_2/TiSi_2$, or $TaSiN_x$ are also useful.

A conductive layer 253 is deposited over the barrier layer. The conductive layer serves as the bottom electrode. The bottom electrode comprises a conductive material. Preferably, the conductive material does not react with the subsequently deposited metal oxide ceramic film. In one embodiment, the bottom electrode comprises a noble metal such as Pt, Pd, Au, Ir, or Rh. Other materials such as conducting metal oxides, conducting metal nitrides, or super conducting oxides are also useful. Preferably, the conducting metal oxides, conducting metal nitrides, or super conducting oxides do not react with the ferroelectric layer. Conducting oxides include, for example, $IrO_x$, $RhO_x$, $RuO_x$, $OsO_x$, $ReO_x$, or $WO_x$ (where x is greater than about 0 and less than about 2). Conducting metal nitrides include, for example, $TiN_x$, $ZrN_x$ (where x is greater than about 0 and less than about 1.1), $WN_x$, or $TaN_x$ (where x is greater than about 0 and less than about 1.7). Super conducting oxides can include, for example, $YBa_2Cu_3O_{7-x}$, $Bi_2Sr_2Ca_2Cu_3O_x$, or $Bi_2Sr_2Ca_1Cu_2O_y$.

A metal oxide ceramic layer is formed above the conductive layer 153. The metal oxide ceramic comprises a ferroelectric phase or is capable of transformation into a ferroelectric. In one embodiment, the metal oxide ceramic comprises a Bi-based metal oxide ceramic. The Bi-based metal oxide layer is generally expressed by $Y_aBi_bX_2O_c$, where Y comprises a 2-valent cation and X comprises a 5-valent cation. In one embodiment, Y is equal to one or more elements selected from Sr, Ba, Pb, and Ca. X, in one embodiment, is equal to one or more elements selected from Ta and Nb. The subscript "a" refers to the number of Y atoms for every 2x atoms; subscript "b" refers to the number of Bi atoms for every 2x atoms; and subscript "c" refers to the number of oxygen atoms for every 2x atoms.

In one embodiment, the Bi-based oxide ceramic comprises Sr. A Bi-based oxide comprising Sr and Ta is also useful. Preferably, the Bi-oxide comprises SBT expressed generally by $Sr_aBi_bTa_2O_c$. The SBT can be more specifically expressed by, for example, the $SrBi_2Ta_2O_9$. The ferroelectric SBT comprises a layered perovskite structure having negatively charged perovskite layers of Sr and Ta oxide separated by positively charged Bi oxide layers. The stoichiometry of the Sr and Ta oxide is for example $[SrTa_2O_7]^{2n-}{}_n$, and the stoichiometry of the Bi oxide layers is for example $[Bi_2O_2]^{2n+}{}_n$, creating a structure of alternating $[SrTa_2O_7]^{2n-}{}_n$ and $[Bi_2O_2]^{2n+}{}_n$ layers.

Derivatives of SBT are also useful. SBT derivatives include $Sr_aBi_bTa_{2-x}Nb_xO_c(0<x<2)$, $Sr_aBi_bNb_2O_c$, $Sr_{a-x}Ba_xBi_bTa_{2-y}Nb_yO_c$ ($0 \leq x \leq a$, $0 \leq y \leq 2$), $Sr_{a-x}Ca_xBi_bTa_{2-y}Nb_yO_9$ ($0 \leq x \leq a$, $0 \leq y \leq 2$), $Sr_{a-x}Pb_xBi_bTa_{2-y}Nb_yO_c$ ($0 \leq x \leq a$, $0 \leq y \leq 2$), or $Sr_{a-x-y-z}Ba_xCa_yPb_zBi_bTa_{2-p}Nb_pO_c$ ($0 \leq x+y+z \leq a$, $0 \leq p \leq 2$). Substituting or doping the Bi-based oxides or SBT derivatives with a metal of the lanthanide series is also useful. Metal oxide ceramics such as PZT, PZT derivatives, or other types of metal oxide ceramics are also useful.

Various techniques, such as such as sol-gel, chemical vapor deposition (CVD), sputtering, pulsed laser deposition (PLD), and evaporation, are used to form the Bi-based metal oxide. Preferably, the Bi-based metal oxide is formed by CVD. In one embodiment, the Bi-based oxide is deposited by low temperature CVD techniques. Low temperature techniques are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which is herein incorporated by reference for all purposes. Depositing the Bi-based oxide amorphously by CVD is also useful. CVD Amorphously deposited Bi-based oxide layers are described in co-pending U.S. patent application Ser. No. 09/107,861, titled "Amorphously Deposited Metal Oxide Ceramic Films" (attorney docket number 98P7422), which is herein incorporated by reference for all purposes.

The precursors can be individually dissolved in a solvent system and stored in a respective reservoir of the delivery subsystem. The precursors are mixed in the correct ratio prior to deposition. Mixing the precursors in a single reservoir is also useful. The precursors should be highly soluble in the solvent system. The solubility of the precursors in the solvent system is, for example, about 0.1–5M. Solubility of about 0.1–2M or about 0.1–1M is also useful.

A scavenger layer 575 is formed over the metal oxide layer 555. The scavenger layer comprises, for example, metal or metal oxide that can react with the mobile specie from the metal oxide ceramic layer. The scavenger layer is formed by conventional deposition techniques, such as CVD, sputtering, or sol-gel. Other techniques are also useful to form the scavenger layer.

In one embodiment, the scavenger layer comprises a material that reacts with the mobile specie of a Bi-based oxide ceramic. Typically, the mobile specie of Bi-based ceramics comprises Bi or $Bi_2O_3$. Materials that react readily with Bi or $Bi_2O_3$ include, for example, titanium (Ti) or titanium oxide ($TiO_2$). Ti or $TiO_2$ reacts with Bi or $Bi_2O_3$ to form, for example, $Bi_4Ti_3O_{12}$ (BTO). Other materials that react with Bi or $Bi_2O_3$ include metals, such as zirconium (Zr), tungsten (W), niobium (Nb), tantalum (Ta), molybdenum (Mo), vanadium (V), or chromium (Cr), and their oxides $ZrO_x$, $WO_x$, $NbO_x$, $TaO_x$, $MoO_x$, $VO_x$, or $CrO_x$. Also, group IV, V, and VI transitional metals and their oxides are also useful.

The thickness of the scavenger layer should be sufficiently thick enough to consume the excess mobile specie from the metal oxide ceramic. In one embodiment, the thickness of the scavenger layer should be as thin as possible while thick enough to consume the excess mobile specie from the metal oxide ceramic in order to reduce or minimize its affect on the functionality of the device. Typically, the scavenger layer is about 1–10 nm thick, preferably about 2–5 nm thick.

An anneal is performed after the formation of the scavenger layer. The anneal serves to transform the metal oxide ceramic into the ferroelectric phase and to promote grain growth in the metal oxide ceramic in order to improve its electrical properties, such as 2Pr. The anneal is typically performed at 750–800° C. for about 1–30 minutes in an oxygenated ambient. Lower temperatures are also useful to promote grain growth. For example, the anneal can be performed at about 650–750° C. Lower temperatures, however, may require a longer anneal to achieve the desired grain size of, for example, about 30–120 minutes. The duration of the anneal can vary depending on the grain size desired.

The relatively high temperature and long duration of the anneal causes the excess mobile specie to diffuse from the metal oxide ceramic layer. The excess mobile specie reacts with the scavenger layer. The reaction consumes the excess mobile specie, thereby reducing or minimizing its diffusion into unwanted regions of the device.

In one embodiment, the anneal facilitates a reaction between the excess mobile specie (Bi or $Bi_2O_3$) from the Bi-based oxide ceramic and the scavenger layer. The reaction attracts the excess mobile specie into the scavenger layer. As the excess Bi migrates to the Ti or $TiO_2$ scavenger layer, there is a strong driving force to produce a Bi-Ti-O compound such as, for example, $Bi_4Ti_3O_{12}$ (BTO).

The resulting Bi-Ti-O scavenger layer may comprise various phases, including ferroelectric and high dielectric phases. The different phases produce an overall effect which may result in only a small reduction in the electric field applied to the ferroelectric layer 555. As such, the scavenger layer can remain as part of the IC structure. Removal of the scavenger layer can also be useful if desired or necessary.

A conductive layer 257 is deposited over the scavenger layer to form the top electrode. Alternatively, the scavenger layer can be removed by, for example, an etch or CMP prior to the formation of the top electrode. The conductive layer comprises, for example, noble metal such as Pt, Pd, Au, Ir, or Rh. Other materials such as those used to form the bottom electrode are also useful.

An anneal can be performed after the deposition of the top electrode to ensure a well-defined interface between the scavenger layer and the electrode or between the metal oxide ceramic and the electrode if the scavenger layer has been removed. The anneal to recover the interface is performed at, for example, about 500–800° C. for about 1–30 minutes in oxygen ambient with $O_2$ flow rate of about 5 slm. Having a well-defined interface between the electrode and metal oxide ceramic is advantageous as this reduces, for example, leakage currents.

The various layers of the capacitor are masked and etched to form the capacitor 250. Additional processing is performed to complete the ferroelectric memory IC. Such additional processing is known in the art. For example, the additional processing includes forming support circuitry, contact openings to the bitline, final passivation layer, contact openings in the passivation layer for testing and connecting to lead frame, and packaging.

In an alternative embodiment, a first post-deposition heat treatment or a pre-anneal fully or partially transforms the as-deposited metal oxide ceramic layer into the desired phase, such as the ferroelectric or Aurivillius phase. The pre-anneal is performed at a relatively low temperature to avoid substantial amount of excess mobile specie diffusing from the metal oxide ceramic to avoid destruction of device regions below.

The pre-anneal is performed at less than about 750° C. In one embodiment, the pre-anneal is performed at about 700–750° C. The duration of the pre-anneal is about 5–10 minutes. In another embodiment, the pre-anneal is performed at less than 700° C. At lower temperatures, a longer per-anneal may be required to partially or fully transform the metal oxide ceramic into the ferroelectric phase.

After the pre-anneal, a scavenger layer is deposited over metal oxide ceramic. Another anneal then fully transforms the metal oxide ceramic into the ferroelectric phase if it has not already been fully transformed and to promote grain growth to achieve the desired electrical properties. During this anneal, the excess mobile specie reacts with the scavenger layer, preventing it from diffusing into the substrate below. The scavenger layer can be removed as needed or as desired prior to the formation of the top electrode. Another anneal can be performed after formation of the top electrode to ensure that a well-defined metal oxide ceramic/electrode or scavenger layer/electrode interface. The anneal to ensure the well-defined interface can be combined with the anneal to achieve good electrical characteristics.

In another embodiment, the anneal to fully transform the metal oxide ceramic into the ferroelectric phase, to promote grain growth, and to ensure a well-defined metal oxide ceramic/electrode interface can be performed after the formation of the top electrode.

In an alternative embodiment, a conductive layer is formed over the metal oxide ceramic after it has been pre-annealed. A scavenger layer is then formed over the conductive layer. An anneal is performed to grow the grains of the metal oxide ceramic to obtain the desired electrical characteristics and to ensure a well-defined metal oxide ceramic/electrode interface. Although not necessary, the scavenger layer can be removed as desired after the anneal.

Figure 4A:
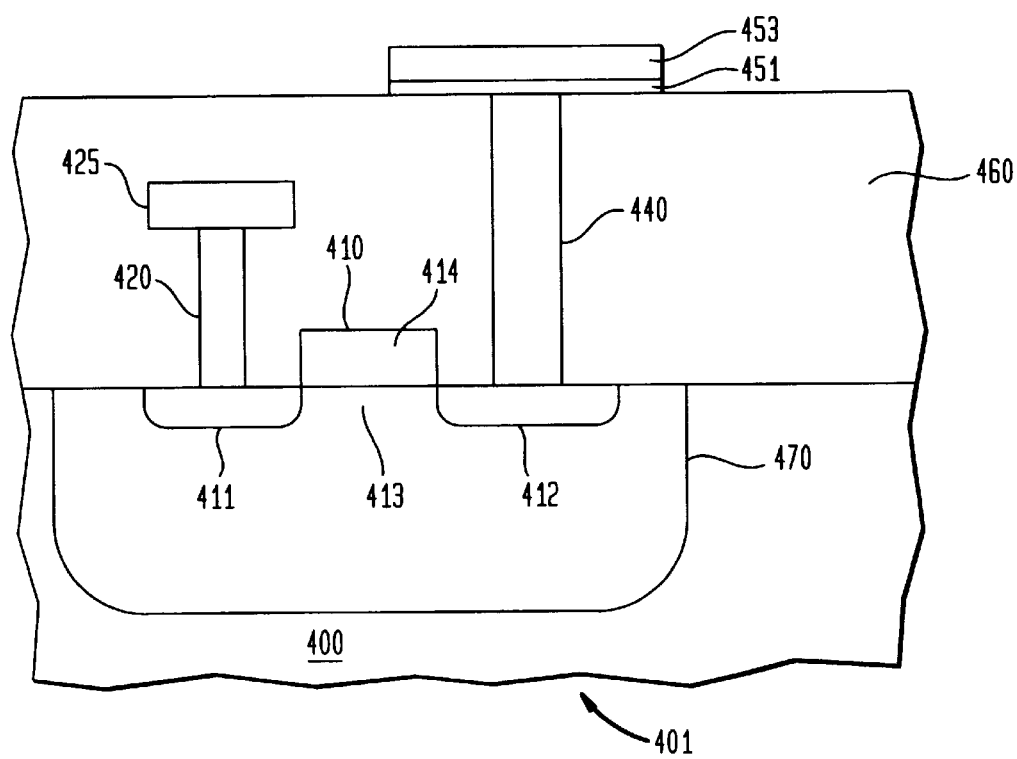
FIGS. 4a–4b show a process for forming an alternative embodiment of the invention.
Figure 4B:
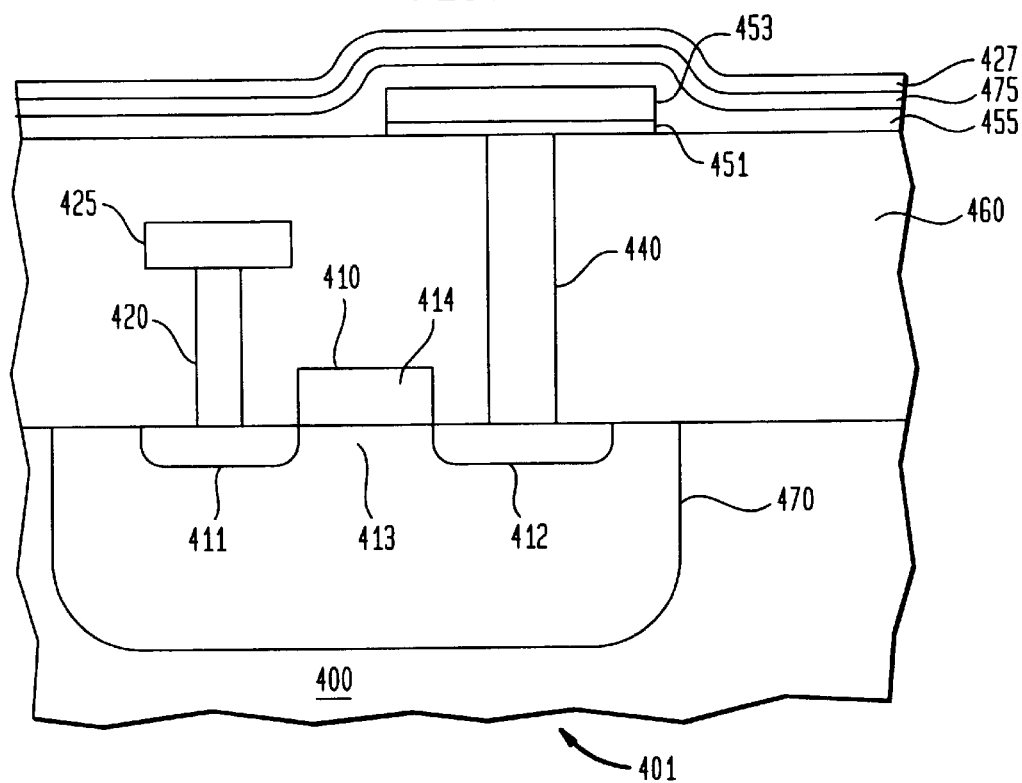

FIGS. 4a–b show another embodiment of the invention. As shown, a substrate 401 comprises a partially formed memory cell as described in FIG. 3a. Similar reference numbers designate similar features.

A barrier layer 451 and conductive layer 453 serving as a bottom electrode are deposited on the ILD layer 460. The barrier layer and conductive layer are patterned to form the bottom electrode. The bottom electrode is coupled to the diffusion region 412 by contact plug 440.

Referring to FIG. 4b, a metal oxide ceramic layer 455 is formed over the bottom electrode and ILD layer. The metal oxide ceramic, in one embodiment, comprises a ferroelectric phase or is capable of transformation into a ferroelectric. A scavenger layer 475 is formed above the metal oxide ceramic. The scavenger layer comprises a material that reacts with the excess mobile specie from the metal oxide ceramic.

An anneal is performed to transform the metal oxide ceramic into a ferroelectric with good electrical properties. The anneal also causes the excess mobile to diffuse out and react with the scavenger layer. A conductive layer 457 is deposited over the scavenger layer to form the top electrode. Removing the scavenger layer prior to the formation of the top electrode is also useful. An anneal can be performed to ensure a well-defined metal oxide ceramic/electrode or scavenger/electrode interface.

The top electrode typically serves as a common electrode, connecting other capacitors in the memory array. The top electrode, along with the other layers underneath, can be patterned as necessary to provide contact openings to the bitlines and wordlines. Additional processing is performed to complete the ferroelectric memory IC.

In an alternative embodiment, a pre-anneal fully or partially transforms the as-deposited metal oxide ceramic layer into the ferroelectric or Aurivillius phase. After the pre-anneal, a scavenger layer is deposited over metal oxide ceramic. Another anneal then fully transforms the metal oxide ceramic into the ferroelectric phase if it has not already been fully transformed and to promote grain growth to achieve the desired electrical properties. The scavenger layer can be removed as needed or as desired prior to the formation of the top electrode. Another anneal can be performed after formation of the top electrode to ensure that a well-defined metal oxide ceramic/electrode or scavenger/electrode interface.

Alternatively, an anneal to fully transform the metal oxide ceramic into the ferroelectric phase, to promote grain growth, and to ensure a well-defined metal oxide ceramic/electrode interface is performed after the formation of the top electrode.

In an alternative embodiment, a conductive layer is formed over the metal oxide ceramic after it has been pre-annealed. A scavenger layer is then formed over the conductive layer. An anneal is performed to grow the grains of the metal oxide ceramic to obtain the desired electrical characteristics and to ensure a well-defined metal oxide ceramic/electrode interface. Although not necessary, the scavenger layer can be removed as desired after the anneal.

Figure 5:
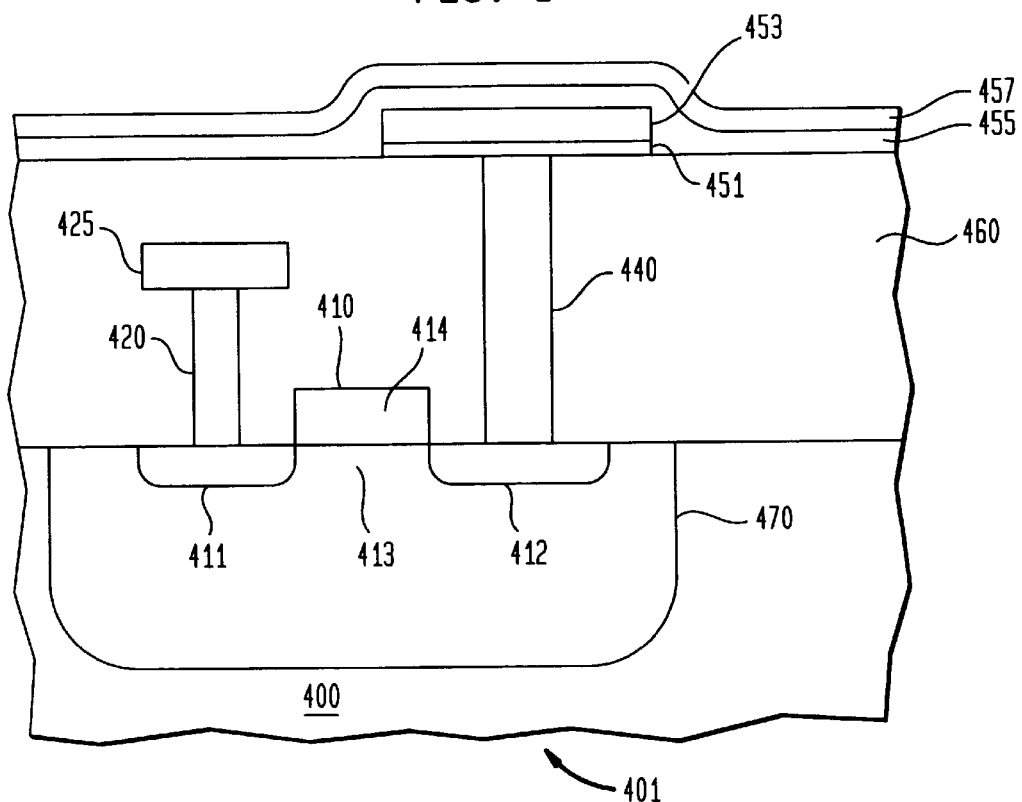
FIGS. 5–9 show alternative embodiments of the invention.

Alternatively, as shown in FIG. 5, the scavenger layer is removed after the anneal to promote grain growth. Removal of the scavenger layer may be necessary if the reaction between the scavenger layer and excess mobile specie forms a layer that undesirably affects the operation or functionality of the device. The scavenger layer is removed selective to the metal oxide ceramic layer 455. A conductive layer 457 is then deposited over the metal oxide ceramic layer to form the top electrode. Another anneal can be performed after formation of the top electrode to ensure that a well-defined metal oxide ceramic/electrode or scavenger layer/electrode interface. The top electrode, along with the other layers underneath, can be patterned as necessary to provide contact openings to the bitlines and wordlines. Additional processing is performed to complete the ferroelectric memory IC.

Figure 6:
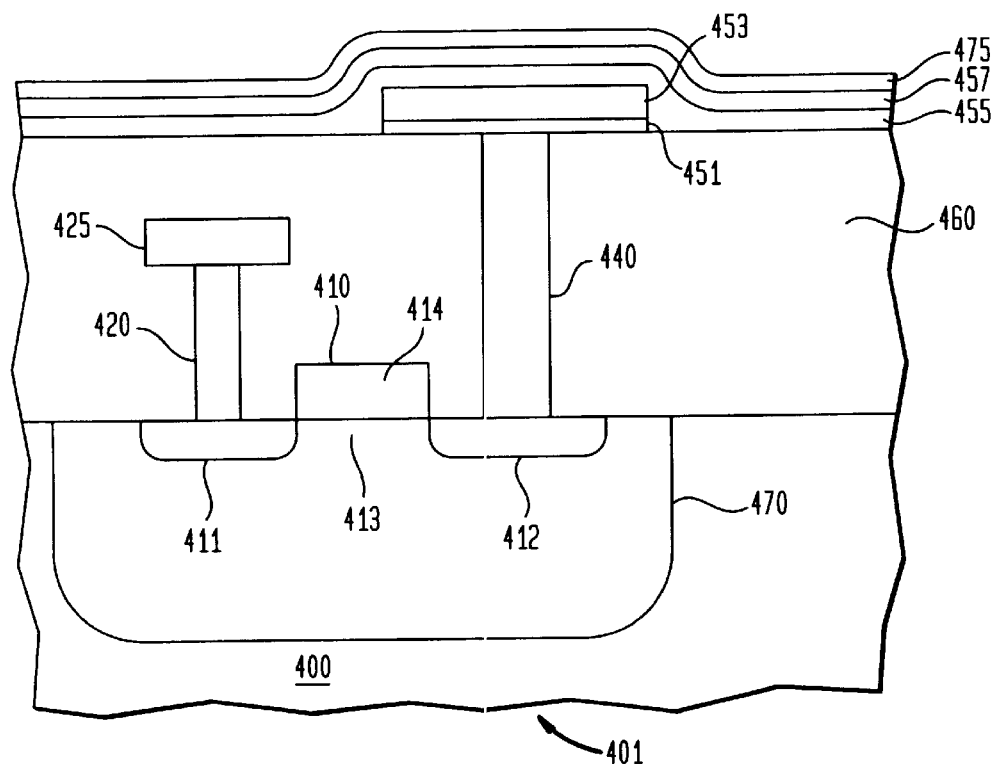

In another embodiment, as shown in FIG. 6, the conductive layer 457 is deposited over the metal oxide ceramic layer to form the top electrode after the pre-anneal. The scavenger layer is formed over the top electrode. An anneal is performed to grow the grains of the metal oxide ceramic to obtain the desired electrical characteristics and to ensure a well-defined metal oxide ceramic/electrode interface. As the scavenger layer is above the electrode, it does not affect the operation of the device. Although not necessary, the scavenger layer can be removed as desired. The scavenger layer or top electrode, along with the other layers underneath, can be patterned as necessary to provide contact openings to the bitlines and wordlines. Additional processing is performed to complete the ferroelectric memory IC.

Figure 7:
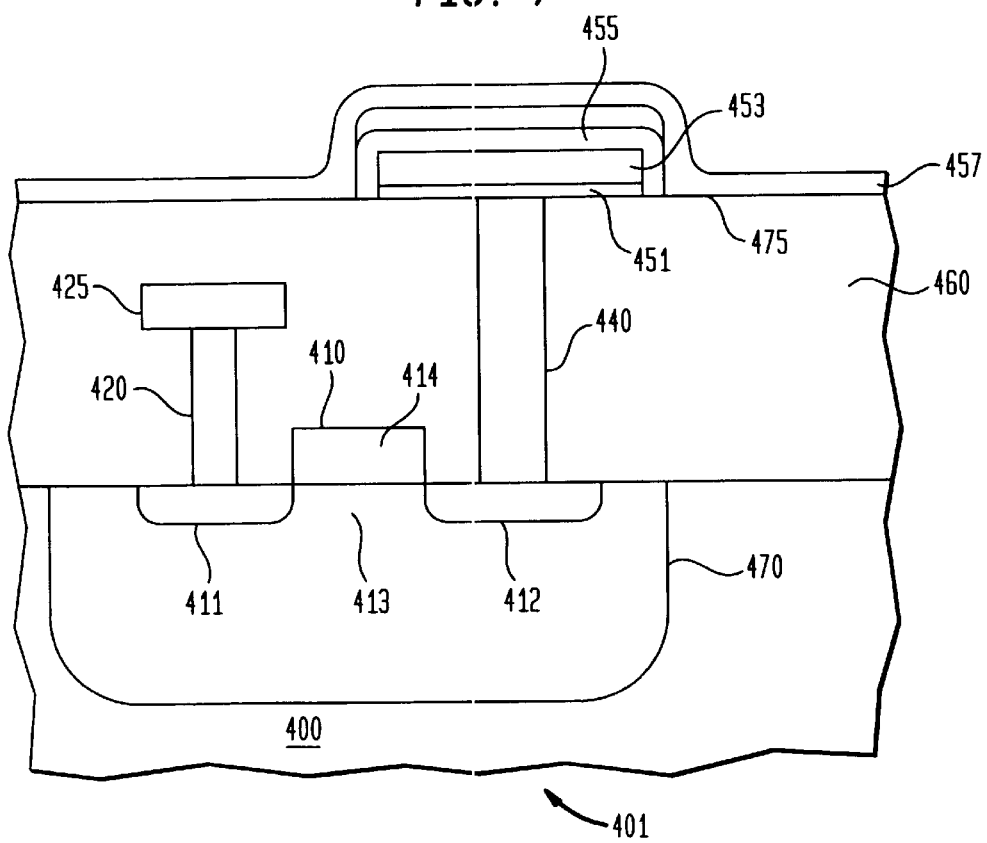

FIG. 7 shows another embodiment of the invention. Similar reference numbers to other figures designate similar features. As shown, a metal oxide ceramic 455 is formed over the patterned bottom electrode 455 and electrode barrier layer 451. The metal oxide ceramic, in one embodiment, comprises a ferroelectric phase or is capable or transformation into a ferroelectric. A scavenger layer 475 is formed above the metal oxide ceramic. The scavenger layer comprises a material that reacts with the excess mobile specie from the metal oxide ceramic.

An anneal is performed to grown the grains of the metal oxide ceramic in order to obtain the desired electrical characteristics. The anneal also causes the excess mobile to diffuse out and react with the scavenger layer. After the anneal, the scavenger and metal oxide ceramic layers are patterned to cover the bottom electrode. A conductive layer 457 is then deposited over the scavenger layer to form the top electrode. Another anneal can be performed after formation of the top electrode to ensure that a well-defined metal oxide ceramic/electrode interface. The anneal to ensure the well-defined interface can be combined with the anneal to achieve good electrical characteristics. Additional processing is performed to complete the ferroelectric memory IC.

Alternatively, a pre-anneal can be performed to fully or partially transform the as-deposited metal oxide ceramic layer into the ferroelectric or Aurivillius phase after it has been deposited. Further, the anneal to promote grain growth can be performed after the patterning of the scavenger and metal oxide ceramic layers or after the formation of the top electrode 457.

Figure 8:
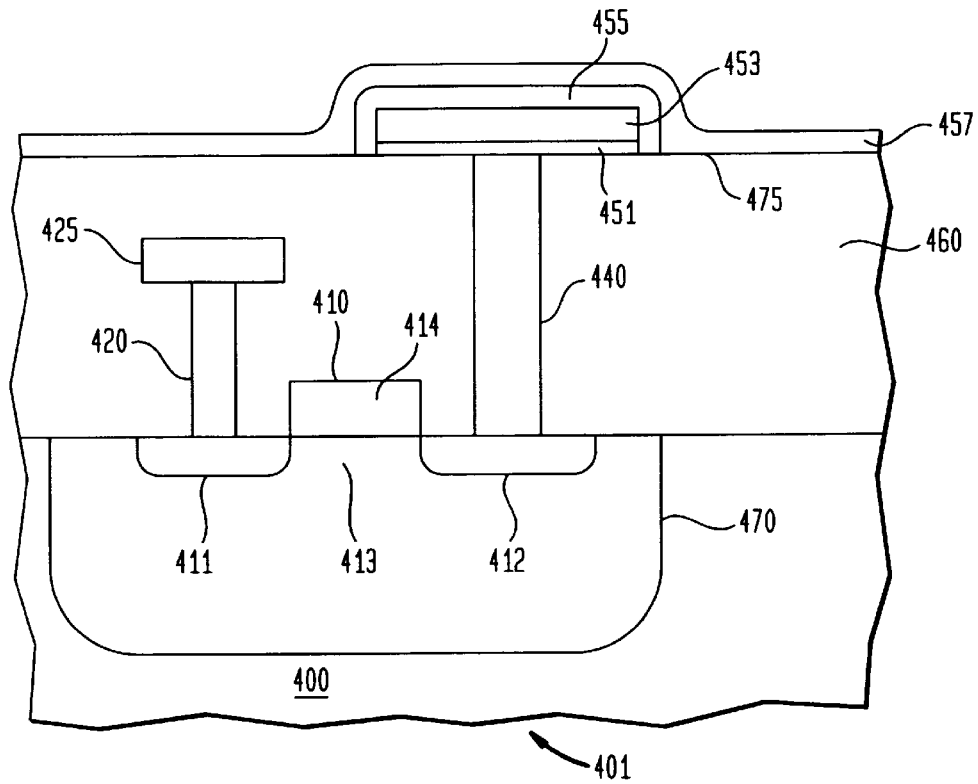

Alternatively, as shown in FIG. 8, a metal oxide ceramic is formed over a patterned bottom electrode 453 and barrier 451. The metal oxide ceramic is patterned to cover the bottom electrode. A scavenger layer is formed over the patterned metal oxide ceramic. Subsequently, an anneal is performed to achieve the desired electrical properties. The anneal causes the diffusion of the excess mobile specie from the metal oxide ceramic, which is consumed by the scavenger layer.

After reacting with the mobile specie, the scavenger layer can be removed by an etch selective to the metal oxide and ILD. A conductive layer 457 is deposited over the scavenger layer to form the top electrode. The top electrode typically serves as a common electrode, connecting other capacitors in the memory array. Additional processing is performed to complete the ferroelectric memory IC.

In an alternative embodiment, a pre-anneal is performed after the deposition of the metal oxide ceramic to fully or partially transform it into the ferroelectric or Aurivillius phase. The scavenger layer is deposited over pre-annealed metal oxide ceramic. Another anneal then fully transforms the metal oxide ceramic into the ferroelectric phase if it has not already been fully transformed and to promote grain growth to achieve the desired electrical properties. The scavenger layer can be removed as needed or as desired prior to the formation of the top electrode. Another anneal can be performed after formation of the top electrode to ensure that a well-defined metal oxide ceramic/electrode or scavenger/electrode interface. The anneal to ensure the well-defined interface can be combined with the anneal to achieve good electrical characteristics.

Alternatively, if the scavenger layer is not removed, an anneal to fully transform the metal oxide ceramic into the ferroelectric phase, to promote grain growth, and to ensure a well-defined metal oxide ceramic/electrode interface can be performed after the formation of the top electrode.

Figure 9:
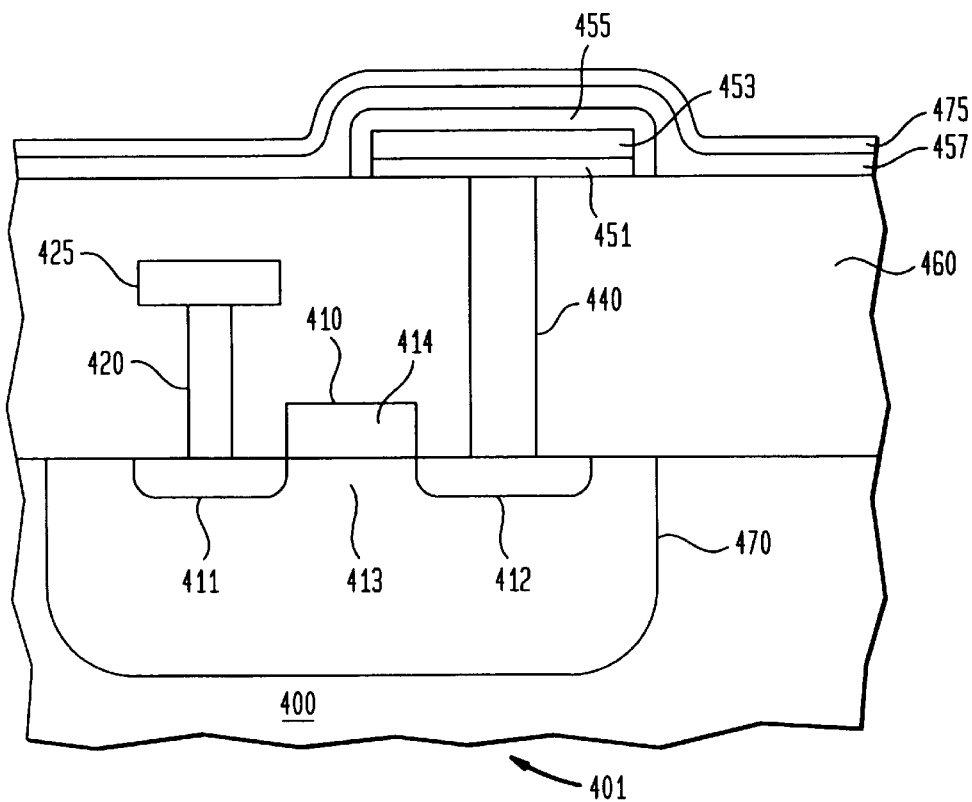

In another embodiment, as shown in FIG. 9, a conductive layer 457 is deposited over the patterned metal oxide ceramic layer 455. A pre-anneal is performed on the metal oxide ceramic either before of after it is patterned. A scavenger layer 475 is formed over the top electrode. An anneal is then performed to grow the grains of the metal oxide ceramic to obtain the desired electrical characteristics and to ensure a well-defined metal oxide ceramic/electrode interface. Since the scavenger layer is above the electrode, it does not affect the operation of the device. Although not necessary, the scavenger layer can be removed as desired. Additional processing is performed to complete the ferroelectric memory IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A process for fabricating a semiconductor device comprising:

providing a substrate including a partially formed semiconductor device;

depositing a metal oxide ceramic over the barrier layer, depositing a scavenger layer above the metal oxide ceramic layer; and annealing the substrate to produce a metal oxide ceramic with good electrical properties, wherein the anneal causes excess mobile specie to diffuse from the metal oxide ceramic, the scavenger layer consuming the excess mobile specie to reduce the diffusion of excess mobile specie into the substrate below.

2. The method as recited in claim 1 wherein the metal oxide ceramic comprises a Bi-based metal oxide ceramic.

3. The method as recited in claim 2 wherein the excess mobile specie comprises Bi.

4. The method as recited in claim 3 wherein the scavenger layer reacts with the excess mobile specie comprising Bi.

5. The method as recited in claim 4 wherein the scavenger layer comprises a metal or metal oxide that reacts with the excess mobile specie comprising Bi.

6. The method as recited in claim 5 wherein the scavenger layer comprises titanium Ti or titanium oxide ($TiO_2$).

7. The method as recited in claim 5 wherein the scavenger layer comprises a metal or an oxide of a metal selected from the group comprising zirconium, tungsten, niobium, tantalum, molybdenum, vanadium, or chromium.

8. The method as recited in claim 5 wherein the scavenger layer comprises a metal or an oxide of a metal selected from the group comprising group IV, V, and VI transitional metals.

9. The method as recited in claim 2 further comprises pre-annealing the Bi-based metal oxide ceramic after it has been deposited, the pre-anneal at least partially transforming the metal oxide ceramic into the desired phase.

10. The method as recited in claim 9 wherein the pre-annealing comprises annealing the Bi-based metal oxide ceramic at a relatively low temperature to avoid substantial amount of excess mobile specie diffusing from the metal oxide ceramic to avoid destruction of device regions below.

11. The method as recited in claim 10 wherein the pre-annealing comprises annealing the Bi-based metal oxide ceramic at less than about 750° C.

12. The method as recited in claim 10 wherein the pre-annealing comprises annealing the Bi-based metal oxide ceramic at about 700–750° C.

13. The method as recited in claim 12 wherein the pre-annealing comprises heating the Bi-based metal oxide ceramic for about 5–10 minutes.

14. The method as recited in claim 10 wherein the pre-annealing comprises annealing the Bi-based metal oxide ceramic at less than about 700° C.

* * * * *